(12) United States Patent
Latina (10) Patent No.: US 11,482,408 B2
(45) Date of Patent: Oct. 25, 2022

(54) METHOD OF PROCESSING WAFER

(71) Applicant: DISCO CORPORATION, Tokyo (JP)

(72) Inventor: Steve Latina, Andover, MA (US)

(73) Assignee: DISCO CORPORATION, Tokyo (JP)

( * ) Notice: Subject to any disclaimer, the term of this patent is extended or adjusted under 35 U.S.C. 154(b) by 37 days.

(21) Appl. No.: 16/909,209

(22) Filed: Jun. 23, 2020

(65) Prior Publication Data

US 2021/0398795 A1    Dec. 23, 2021

(51) Int. Cl.
*H01L 21/02* (2006.01)

(52) U.S. Cl.
CPC .. *H01L 21/02021* (2013.01); *H01L 21/02282* (2013.01)

(58) Field of Classification Search
None
See application file for complete search history.

(56) References Cited

U.S. PATENT DOCUMENTS

| | | | | |
|---|---|---|---|---|
| 4,630,093 A | * | 12/1986 | Yamaguchi | H01L 21/02019 148/33 |
| 5,271,185 A | * | 12/1993 | Hosokawa | B24B 9/065 451/136 |
| 6,174,222 B1 | * | 1/2001 | Sato | B24B 9/065 451/44 |
| 6,358,133 B1 | * | 3/2002 | Cesena | B24D 5/10 451/450 |
| 2018/0085851 A1 | * | 3/2018 | Hirata | B23K 26/0853 |

FOREIGN PATENT DOCUMENTS

JP    08044064 A    2/1996

* cited by examiner

*Primary Examiner* — Stephanie P Duclair
(74) *Attorney, Agent, or Firm* — Greer, Burns & Crain, Ltd.

(57) ABSTRACT

A method of processing a wafer having a first surface and a second surface opposite the first surface is provided. The method includes the steps of: holding the second surface of the wafer such that the first surface thereof is exposed; processing an exposed first surface side of an outer circumferential edge portion of the wafer with a processing tool including a grinding stone made of abrasive grains bound together by a bonding material, thereby forming on the outer circumferential edge portion a slanted surface that is inclined to the first surface so as to be progressively closer to the second surface in a direction from a central area of the wafer toward an outer circumferential edge thereof; and coating the first surface of the wafer with a liquid material according to a spin coating process, thereby forming a resist film on the first surface of the wafer.

9 Claims, 10 Drawing Sheets

METHOD OF PROCESSING WAFER

BACKGROUND OF THE INVENTION

Field of the Invention

The present invention relates to a method of processing a wafer.

Description of the Related Art

Electronic devices represented by mobile phones and personal computers include as indispensable components device chips having devices such as electronic circuits. Device chips are fabricated by demarcating the face side of a wafer made of a semiconductor such as silicon into a plurality of areas along projected dicing lines known as streets, forming devices in the respective areas, and then dividing the wafer along the projected dicing lines.

The devices described above are generally formed by stacking metal films, insulating films, etc. on the wafer in a thickness direction thereof and processing the stacked films according to predetermined patterns corresponding to the devices. The metal films, the insulating films, etc. are processed, for example, by an etching process in which an etchant such as a highly reactive gas, a chemical solution, or the like is applied to a target film through a mask in the form of a resist film produced by coating the target film with a liquid material by a spin coating process (see, for example, Japanese Patent Laid-Open No. Hei 8-44064).

SUMMARY OF THE INVENTION

When the resist film is formed on the wafer by the spin coating process, the resist film tends to swell in a thicker shape or a granular shape on an outer circumferential edge portion of the wafer, and hence is highly likely to decrease in planarity. In the thicker swelling portion of the resist film, the solvent is not sufficiently removed by a subsequent prebaking process. Therefore, in a case where a contact-type exposure process is carried out to expose the resist film to light through a photomask held in contact with the resist film, the material of the resist film is liable to stick to the photomask.

In addition, a gas may be also trapped in the thicker swelling portion of the resist film. In a case where the gas is trapped in the thicker swelling portion of the resist film, the trapped gas tends to expand in a subsequent heating process, i.e., a heating process that is carried out to paste the wafer with the resist film formed thereon to another wafer, possibly bursting the thicker swelling portion of the resist film and contaminating the environment with resist film fragments.

It is therefore an object of the present invention to provide a method of processing a wafer in a manner to make it less likely to have a resist film swell on an outer circumferential edge portion of the wafer.

In accordance with an aspect of the present invention, there is provided a method of processing a wafer having a first surface and a second surface opposite the first surface, including the steps of: holding the second surface of the wafer such that the first surface thereof is exposed; after holding the second surface of the wafer, processing an exposed first surface side of an outer circumferential edge portion of the wafer with a processing tool including a grinding stone made of abrasive grains bound together by a bonding material, thereby forming on the outer circumferential edge portion a slanted surface that is inclined to the first surface so as to be progressively closer to the second surface in a direction from a central area of the wafer toward an outer circumferential edge thereof; and after forming the slanted surface, coating the first surface of the wafer with a liquid material according to a spin coating process, thereby forming a resist film on the first surface of the wafer.

Alternatively, in accordance with an aspect of the present invention, the processing tool includes a frustoconical cutting blade including a first side surface having a circular outer circumferential edge, a second side surface having a circular outer circumferential edge that is larger in diameter than the first side surface and positioned opposite the first side surface, and an outer circumferential surface formed of the grinding stone and connecting the outer circumferential edge of the first side surface and the outer circumferential edge of the second side surface to each other, the outer circumferential surface being inclined to the first side surface and the second side surface, and the step of forming the slanted surface includes the step of causing the cutting blade to cut into the outer circumferential edge portion of the wafer such that the second side surface of the cutting blade is positioned closer to the outer circumferential edge of the wafer.

Alternatively, in accordance with an aspect of the present invention, the processing tool includes a disk-shaped cutting blade including a first side surface having a circular outer circumferential edge, a second side surface having a circular outer circumferential edge and positioned opposite the first side surface, and an outer circumferential surface formed of the grinding stone and connecting the outer circumferential edge of the first side surface and the outer circumferential edge of the second side surface to each other, and the step of forming the slanted surface includes the step of causing the cutting blade to cut into the outer circumferential edge portion of the wafer while the cutting blade is being rotated by a rotational shaft inclined to the first surface of the wafer.

Further alternatively, in accordance an aspect of the present invention, the processing tool includes a grinding wheel having the grinding stone.

In the method of processing a wafer according to an aspect of the present invention, since the slanted surface that is inclined to the first surface so as to be progressively closer to the second surface in the direction from the central area of the wafer toward an outer circumferential edge thereof is formed on the first surface side of the outer circumferential edge portion of the wafer, when a liquid material that is to turn into a resist film is applied to the first surface of the wafer by a spin coating process, it is easy for the liquid material to flow down the slanted surface and drain off from the wafer 11 to the outside thereof, upon flowing from the central area of the wafer toward the outer circumferential edge thereof. In other words, as the liquid material is less likely to accumulate on the outer circumferential edge portion of the wafer, the possibility that the resist film formed from the applied liquid material will swell on the outer circumferential edge portion of the wafer is reduced.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Preferred embodiments of the present invention will be described in detail below with reference to the accompanying drawings.

First Embodiment

Figure 1:
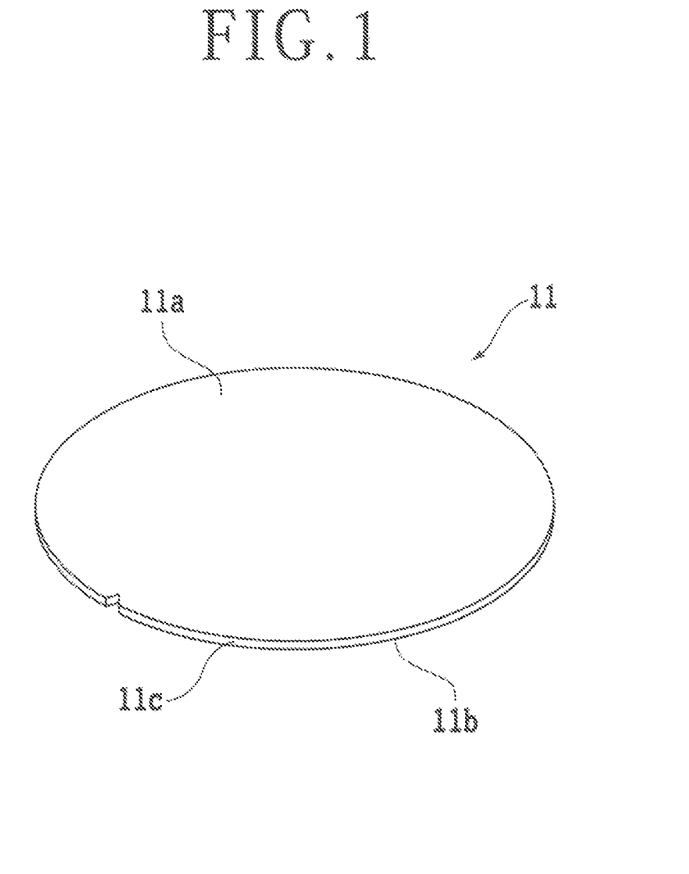
FIG. 1 is a perspective view of a wafer.

FIG. 1 illustrates in perspective a wafer 11 to be processed by a method of processing a wafer according to a first embodiment of the present invention. As illustrated in FIG. 1, the wafer 11 is made of a semiconductor such as silicon and is of a disk shape having a first surface 11a and a second surface 11b opposite the first surface 11a, i.e., on the back side of the wafer 11. Each of the first surface 11a and the second surface 11b is of a generally flat circular shape. In addition, the first surface 11a and the second surface 11b are joined to each other by an outer circumferential edge surface 11c curved by beveling.

The wafer 11 is free of devices such as electronic circuits. However, the method of processing a wafer according to the present embodiment is also able to process a wafer with devices formed thereon. The wafer 11 is not limited to any materials, structures, sizes, etc. For example, wafers made of other semiconductors, ceramics, resins, metals, or the like can be processed by the method of processing a wafer according to the present embodiment. Furthermore, the wafer 11 may be pasted to another wafer, a substrate, or the like in a subsequent step.

Figure 2:
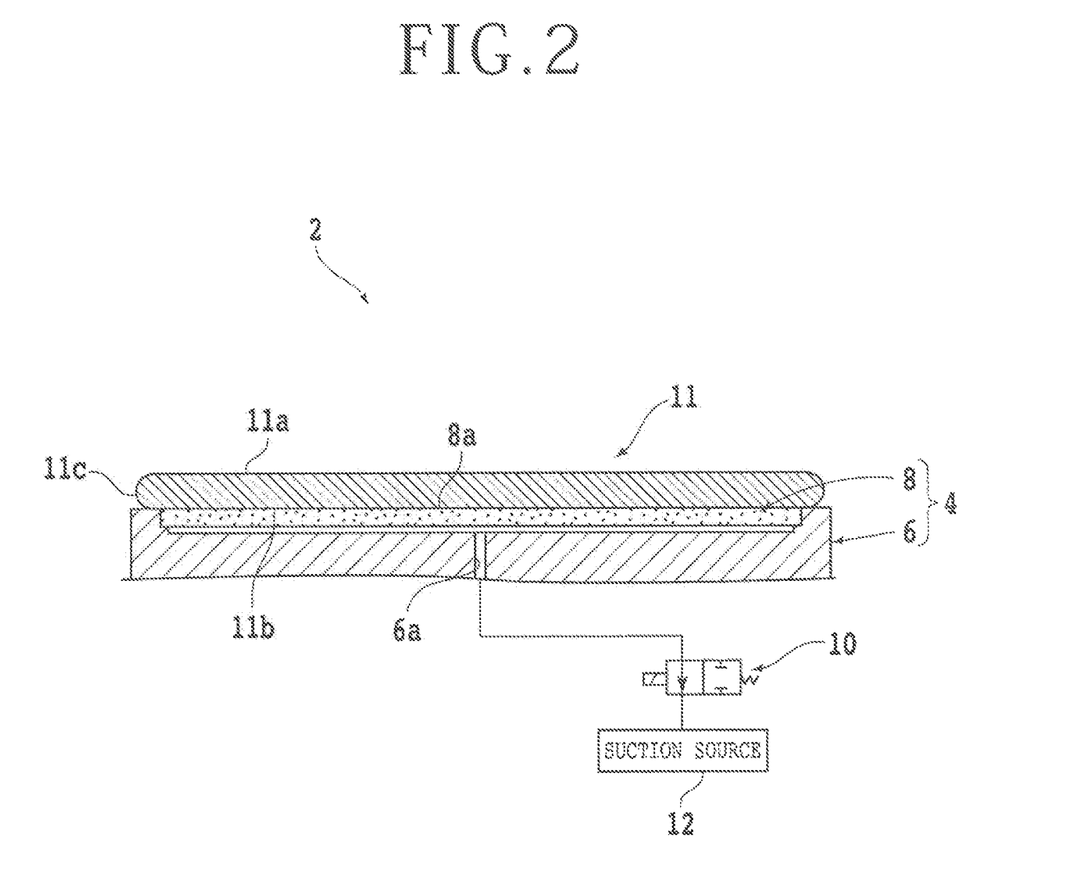
FIG. 2 is a cross-sectional view illustrating a manner in which the wafer is held in place in a method of processing a wafer according to a first embodiment of the present invention.

In the method of processing a wafer according to the present embodiment, the second surface lib of the wafer 11 is held in place such that the first surface 11a thereof is exposed (holding step). FIG. 2 illustrates in cross section a manner in which the wafer 11 is held in place. In FIG. 2, some components are represented by symbols and a functional block.

The wafer 11 is held in place using a processing apparatus 2 illustrated in FIG. 2, for example. The processing apparatus 2 includes a chuck table, i.e., holding table, 4 configured to be able to hold the wafer 11 thereon. The chuck table 4 includes a cylindrical frame 6 made of a metal material such as stainless steel, for example, and having a recess defined in an upper surface thereof. The frame 6 has a fluid channel 6a defined therein for transmitting a negative pressure to be used for attracting the wafer 11 under suction on the chuck table 4.

The chuck table 4 also includes a porous plate 8 securely placed in the recess of the frame 6. The porous plate 8 is made of ceramics and hence is rendered porous thereby. The porous plate 8 has an upper surface, i.e., holding surface, 8a for holding the wafer 11 thereon. A suction source 12 such as a vacuum pump is connected through a valve 10 to the fluid channel 6a in the frame 6. When the valve 10 is opened while the suction source 12 is in operation, a vacuum pressure generated by the suction source 12 is transmitted through the valve 10 and the fluid channel 6a and acts on the upper surface 8a of the porous plate 8.

A rotary actuator, not depicted, such as an electric motor is coupled to the frame 6 of the chuck table 4. When the rotary actuator is energized, it generates and transmits rotational power to the frame 6, rotating the chuck table 4 about a central axis generally perpendicular to the upper surface 8a of the porous plate 8. In addition, the frame 6 of the chuck table 4 is supported on a table moving mechanism, not depicted. The table moving mechanism moves the frame 6 in a first direction, i.e., a first horizontal direction, generally parallel to the upper surface 8a of the porous plate 8.

For holding the wafer 11 on the chuck table 4, the second surface 11b of the wafer 11 is brought into contact with the upper surface 8a of the porous plate 8, for example, as illustrated in FIG. 2. Then, the valve 10 is opened while the suction source 12 is in operation, allowing the vacuum pressure from the suction source 12 to act on the upper surface 8a of the porous plate 8. Accordingly, the second surface 11b of the wafer 11 is attracted under suction to the upper surface 8a of the porous plate 8. In other words, the second surface 11b of the wafer 11 is held under suction on the chuck table 4 with the first surface 11a exposed upwardly.

According to the present embodiment, the second surface 11b of the wafer 11 is held in direct contact with the upper surface 8a of the porous plate 8. However, a protective member such as a tape may be affixed to the second surface 11b of the wafer 11 in advance. With the protective member affixed to the second surface 11b, the second surface 11b of the wafer 11 is held on the chuck table 4 with the protective member interposed therebetween and can be hence protected against damage due to contact with the porous plate 8 or the like.

Figure 3:
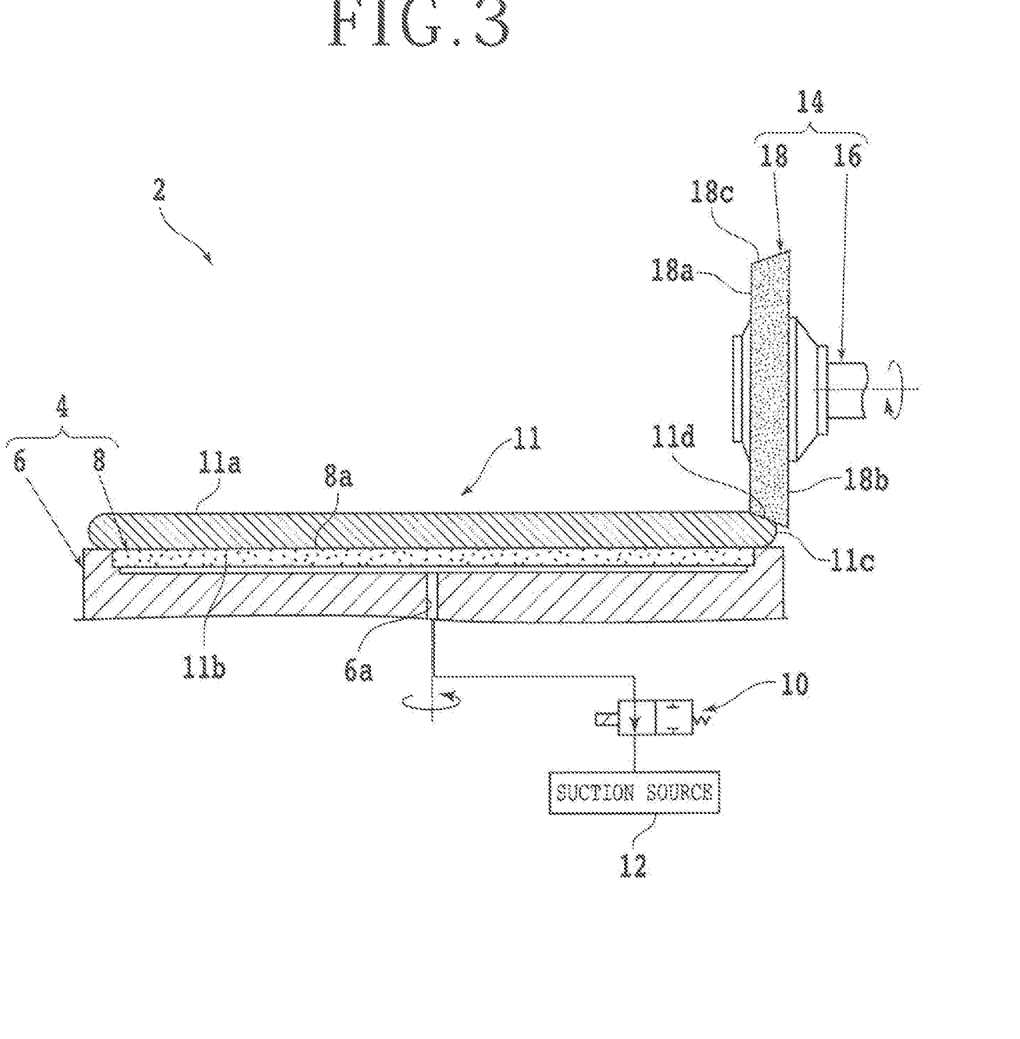
FIG. 3 is a cross-sectional view illustrating a manner in which a slanted surface is formed on the wafer in the method of processing a wafer according to the first embodiment.

After the second surface lib of the wafer 11 has been held on the chuck table 4, an outer circumferential edge portion of the first surface 11a of the wafer 11 is processed to form a slanted surface thereon (processing step). FIG. 3 illustrates in cross section a manner in which a slanted surface 11d is formed on the wafer 11. In FIG. 3, some components are represented by symbols and a functional block.

The slanted surface 11d is formed also using the processing apparatus 2. As illustrated in FIG. 3, a cutting unit, i.e., a processing unit, 14 is disposed above the chuck table 4.

The cutting unit 14 includes a spindle 16 that has a central axis generally parallel to the upper surface 8a of the porous plate 8 and generally perpendicular to the first direction. A cutting blade, i.e., a processing tool, 18 including a grinding stone made of abrasive grains bound together by a bonding material is mounted on one end of the spindle 16.

The other end of the spindle 16 is coupled to a rotary actuator, not depicted, such as an electric motor. When the rotary actuator is energized, it generates and transmits rotational power to the spindle 16, rotating the cutting blade 18 mounted on the other end of the spindle 16 about the central axis thereof. The cutting unit 14 is supported on a cutting unit moving mechanism, not depicted. The cutting unit moving mechanism moves the cutting unit 14 in a second direction, i.e., a second horizontal direction, generally parallel to the upper surface 8a of the porous plate 8 and generally perpendicular to the first direction, and in a third direction, i.e., a vertical direction, generally perpendicular to the first direction and the second direction.

The cutting blade 18 is of a frustoconical shape including a first side surface 18a having a circular outer circumferential edge and a second side surface 18b having a circular outer circumferential edge that is larger in diameter than the first side surface 18a and positioned opposite the first side surface 18a, i.e., on the back side of the cutting blade 18, for example. The outer circumferential edge of the first side surface 18a and the outer circumferential edge of the second side surface 18b are connected to each other by an outer circumferential surface 18c inclined to both the first side surface 18a and the second side surface 18b. In addition, at least the outer circumferential surface 18c is formed of a grinding stone made of abrasive grains such as diamond or the like bound together by a bonding material such as a resin.

The cutting blade 18 is mounted on the one end of the spindle 16 such that the first side surface 18a and the second side surface 18b lie generally perpendicular to the axis of the spindle 16. In other words, the first side surface 18a and the second side surface 18b lie generally perpendicular to the second direction.

The width or thickness of the cutting blade 18, i.e., the distance between the first side surface 18a and the second side surface 18b, is optionally set to a value matching the desired width of the slanted surface 11d to be formed. For example, the slanted surface 11d that is of a sufficient width can easily be formed on the wafer 11 by using the cutting blade 18 whose width is in a range from 0.5 mm to 3.0 mm, typically of 1 mm.

For forming the slanted surface 11d on the wafer 11, as illustrated in FIG. 3, the cutting blade 18 as it is rotated by the spindle 16 about the axis thereof is caused to cut into the outer circumferential edge portion of the wafer 11 that includes the boundary between the first surface 11a and the outer circumferential edge surface 11c of the wafer 11. At this time, the cutting blade 18 is caused to cut into the outer circumferential edge portion of the wafer 11 such that the first side surface 18a of the cutting blade 18 is positioned closer to the center of the wafer 11 and the second side surface 18b of the cutting blade 18 is positioned closer to the outer circumferential edge of the wafer 11. Then, the chuck table 4 is rotated to make one revolution about its own central axis.

The height of the cutting unit 14 at the time that the cutting blade 18 cuts into the wafer 11 is adjusted in such a range that only the outer circumferential surface 18c of the cutting blade 18 contacts the wafer 11. Specifically, for example, the height of the cutting unit 14 is adjusted such that the height of the lower end of the first side surface 18a of the cutting blade 18 is equal to or larger than the height of the first surface 11a of the wafer 11 and the height of the lower end of the second side surface 18b of the cutting blade 18 is smaller than the height of the first surface 11a.

The cutting blade 18 is thus allowed to cut into the first surface 11a side of the outer circumferential edge portion of the wafer 11, forming the slanted surface 11d that is joined to the first surface 11a without abrupt height differences. The slanted surface 11d thus formed is inclined to the first surface 11a so as to be progressively closer to the second surface 11b of the wafer 11 in a direction from a central area of the wafer 11 toward an outer circumferential edge thereof.

Specifically, the height of the slanted surface 11d is smaller on the outer circumferential edge surface 11c side, i.e., on an outer side of the wafer 11, than on the first surface 11a side, i.e., on an inner side of the wafer 11. The thickness of the wafer 11 in the outer circumferential edge portion thereof where the slanted surface 11d is formed is smaller on the outer circumferential edge surface 11c side than on the first surface 11a side.

Figure 4:
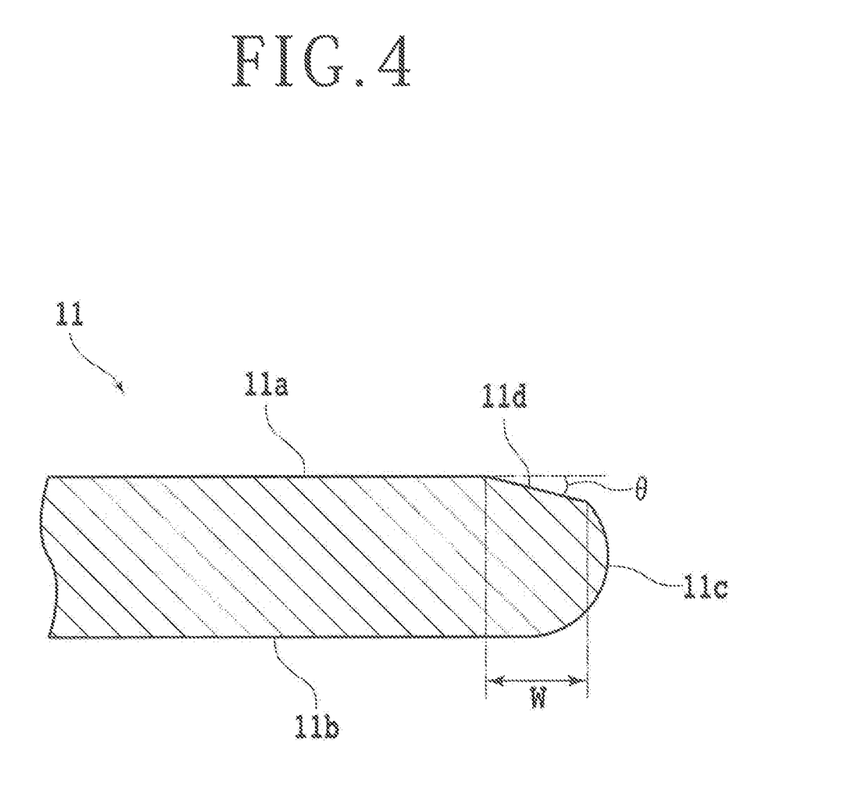
FIG. 4 is an enlarged fragmentary cross-sectional view of the wafer with the slanted surface formed thereon.

FIG. 4 illustrates in enlarged fragmentary cross section the wafer 11 with the slanted surface 11d formed thereon. As illustrated in FIG. 4, the angle Θ formed between the first surface 11a and the slanted surface 11d should preferably be adjusted in a range from 10° to 25°, for example. The angle Θ thus adjusted is effective to keep sufficiently low the possibility that a resist film to be formed on the first surface 11a of the wafer 11 will swell on the outer circumferential edge portion of the wafer 11. Meanwhile, the width W of the slanted surface 11d, i.e., the length of the slanted surface 11d along radial directions of the wafer 11, is adjusted in a range from 0.5 mm to 3.0 mm. However, there is no particular limitation on the width W.

Figure 5:
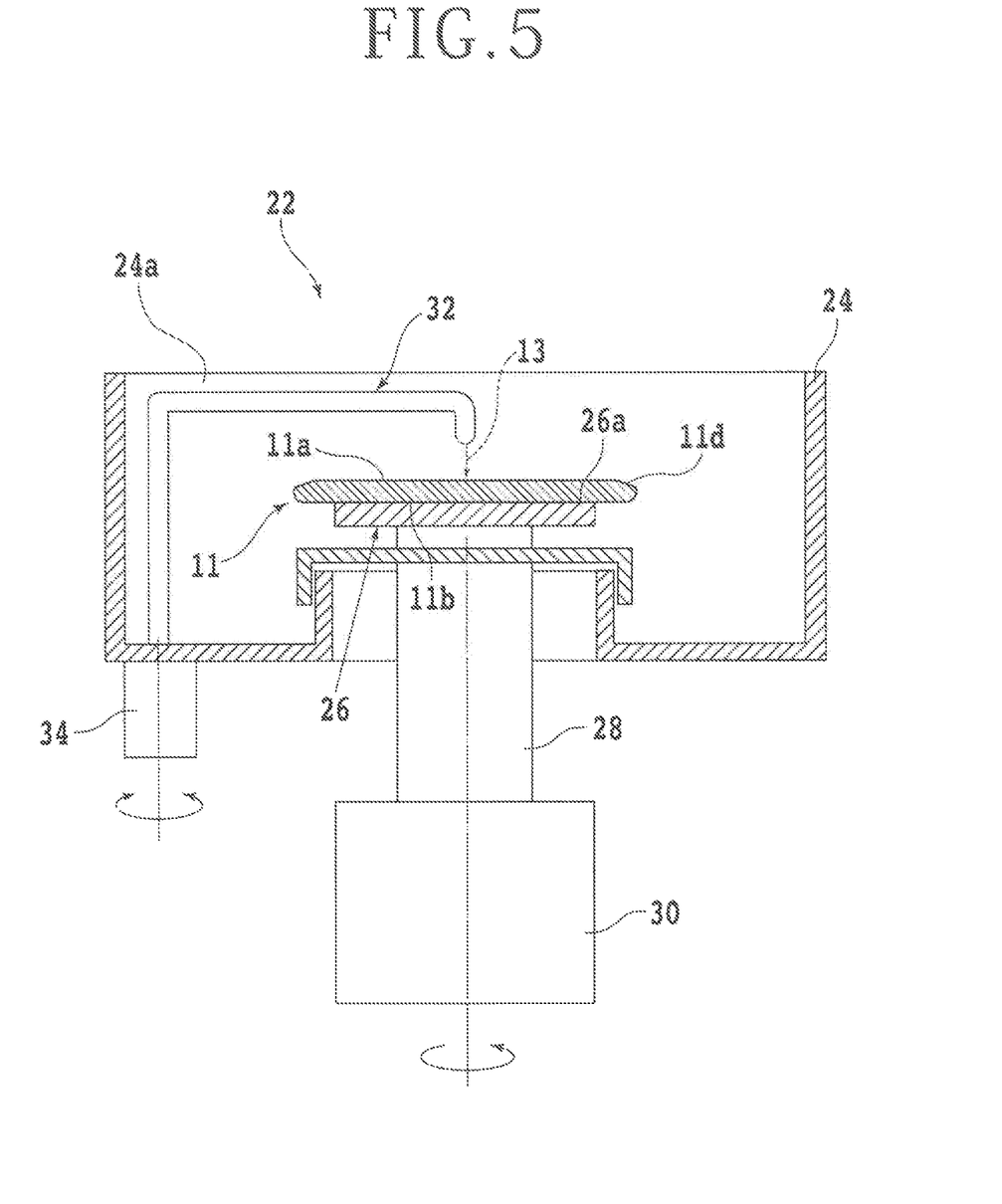
FIG. 5 is a cross-sectional view illustrating a manner in which a resist film is formed on the wafer in the method of processing a wafer according to the first embodiment.

After the slanted surface 11d has been formed on the wafer 11, a liquid material is applied to the first surface 11a of the wafer 11 by a spin coating process, thereby forming a resist film on the first surface 11a of the wafer 11 (resist film forming step). FIG. 5 illustrates in cross section a manner in which a resist film is formed on the wafer 11. The resist film is formed using a spin coater 22 illustrated in FIG. 5, for example.

As illustrated in FIG. 5, the spin coater 22 includes a hollow cylindrical housing 24 that houses the wafer 11 and the like therein. The housing 24 has therein a space 24a as a processing chamber in which a resist film will be formed on the wafer 11. A disk-shaped spinner table 26 that is smaller in diameter than the wafer 11 is disposed centrally in the space 24a. The spinner table 26 has an upper surface, i.e., a holding surface, 26a for holding the wafer 11 thereon.

A suction source, not depicted, such as a vacuum pump is connected to the upper surface 26a of the spinner table 26 through a fluid channel, not depicted, defined in the spinner table 26 and a valve, not depicted. When the valve is opened while the suction source is in operation, a vacuum pressure generated by the suction source can be transmitted through the valve and the fluid channel and act on the upper surface 26a of the spinner table 26. A rotary actuator 30 such as an electric motor is coupled to a lower portion of the spinner table 26 through a spindle 28. When the rotary actuator 30 is energized, it generates and transmits rotational power through the spindle 28 to the spinner table 26, rotating the spinner table 26 about its own central axis.

The spin coater 22 also includes a nozzle 32 disposed above the spinner table 26, for dropping a liquid material 13 from its distal end onto the first surface 11a of the wafer 11. The nozzle 32 has a proximal end coupled to a rotary actuator 34 such as an electric motor. When the rotary actuator 34 is energized, it generates and transmits rotational power to the nozzle 32, moving the distal end of the nozzle 32 to follow an arcuate path over the spinner table 26. When the liquid material 13 is to be dropped onto the wafer 11, the distal end of the nozzle 32 is moved from a retracted region at an end of the space 24a to a dropping region directly above the spinner table 26.

For forming a resist film on the first surface 11a of the wafer 11, the second surface 11b of the wafer 11 is brought into contact with the upper surface 26a of the spinner table 26, as illustrated in FIG. 5, for example. Then, the valve is opened while the suction source is in operation, applying the vacuum pressure to the upper surface 26a of the spinner table 26. The second surface 11b of the wafer 11 is now attracted under suction to the upper surface 26a of the spinner table 26. In other words, the second surface 11b of the wafer 11 is held under suction on the spinner table 26 with the first surface 11a exposed upwardly.

Next, the distal end of the nozzle 32 is moved to the dropping region directly above the spinner table 26. The nozzle 32 then drops the liquid material 13 from the distal end thereof onto the first surface 11a of the wafer 11 held on the spinner table 26. More specifically, the distal end of the nozzle 32 is positioned above a central area of the wafer 11 and drops the liquid material 13 onto the upper surface 11a of the central area of the wafer 11.

Then, the spinner table 26 is rotated about its own central axis by the rotary actuator 30. The spinner table 26 is rotated at a rotational speed in a range from 1000 rpm to 3000 rpm, for example. The spinner table 26 is rotated for a period of time in a range from 10 seconds to 60 seconds, for example. However, there is no particular limitation on the conditions under which to rotate the spinner table 26, for example.

For example, the spinner table 26 may be rotated at a combination of different rotational speeds, e.g., a high rotational speed in a range from 1000 rpm to 3000 rpm and a low rotational speed in a range from 10 rpm to 300 rpm. The rotation of the spinner table 26 causes the liquid material 13 that has been dropped on the wafer 11 to be spread all over the first surface 11a thereof. In other words, the first surface 11a of the wafer 11 is coated in its entirety with the liquid material 13.

According to the present embodiment, an epoxy resin such as SU-8 or the like that is suitable for forming a resist film is used as the liquid material 13. However, there is no particular limitation on the liquid material 13 as well. The liquid material 13 may be changed depending on properties required for the resist film to be formed, for example.

After the liquid material 13 has been spread all over the first surface 11a of the wafer 11, the applied liquid material 13 is dried to evaporate the solvent and water contained in the liquid material 13. For example, the wafer 11 with the liquid material 13 spread thereon is placed on a hot plate that has been heated to a temperature in a range from 80° C. to 120° C. and left on the hot plate for approximately 60 seconds, drying the liquid material 13 together with the wafer 11. When the liquid material 13 is dried, it turns into a resist film 15 (see FIG. 6) covering the first surface 11a in its entirety. However, there is also no particular limitation on the conditions under which to dry the liquid material 13.

For example, after the nozzle 32 has stopped supplying the liquid material 13, the spinner table 26 may be continuously rotated to dry the liquid material 13 applied to the first surface 11a of the wafer 11. Alternatively, an oven, i.e., a drying furnace, a heater, a lamp, or the like may be used in place of the hot plate to heat and dry the liquid material 13. For example, the wafer 11 coated with the liquid material 13 may be introduced into an oven heated to a temperature in a range from 80° C. to 120° C. to dry the liquid material 13. The oven may heat the wafer 11 for a period of time in a range from approximately 10 minutes to approximately 20 minutes, in this case.

Figure 6:
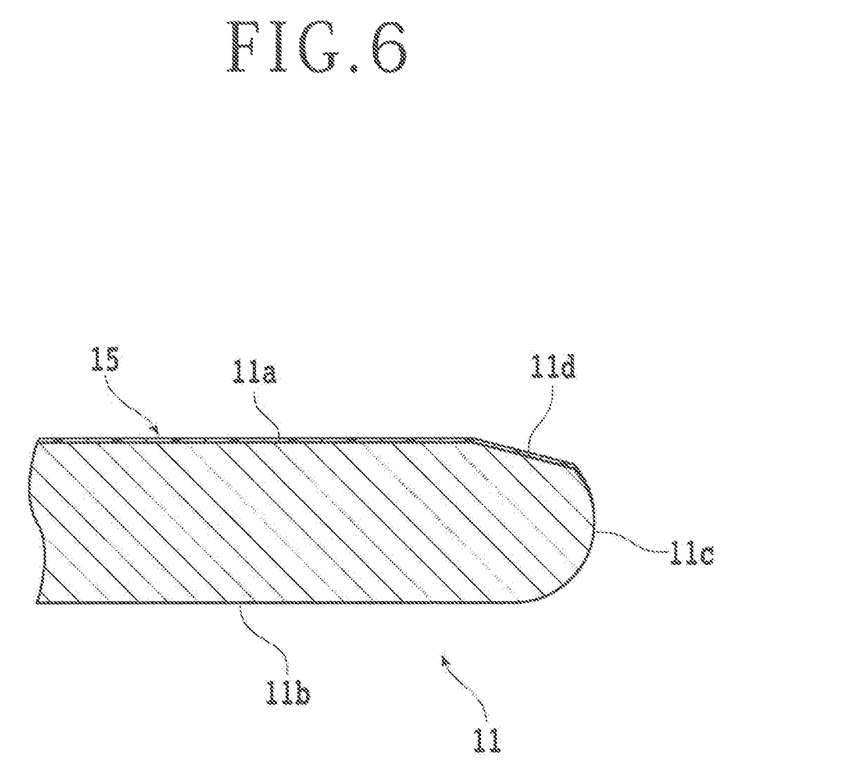
FIG. 6 is an enlarged fragmentary cross-sectional view of the wafer with the slanted surface and the resist film on the wafer.

FIG. 6 illustrates in enlarged fragmentary cross section the wafer 11 with the slanted surface 11d formed thereon and the resist film 15 formed on the wafer 11. As illustrated in FIG. 6, according to the present embodiment, since the slanted surface 11d is formed on the first surface 11a side of the outer circumferential edge portion of the wafer 11, when the liquid material 13 that is to turn into the resist film 15 is applied to the first surface 11a of the wafer 11 by the spin coating process, it is easy for the liquid material 13 to flow down the slanted surface 11d and drain off from the wafer 11 to the outside thereof, upon flowing from the central area of the wafer 11 toward the outer circumferential edge thereof.

Figure 7:
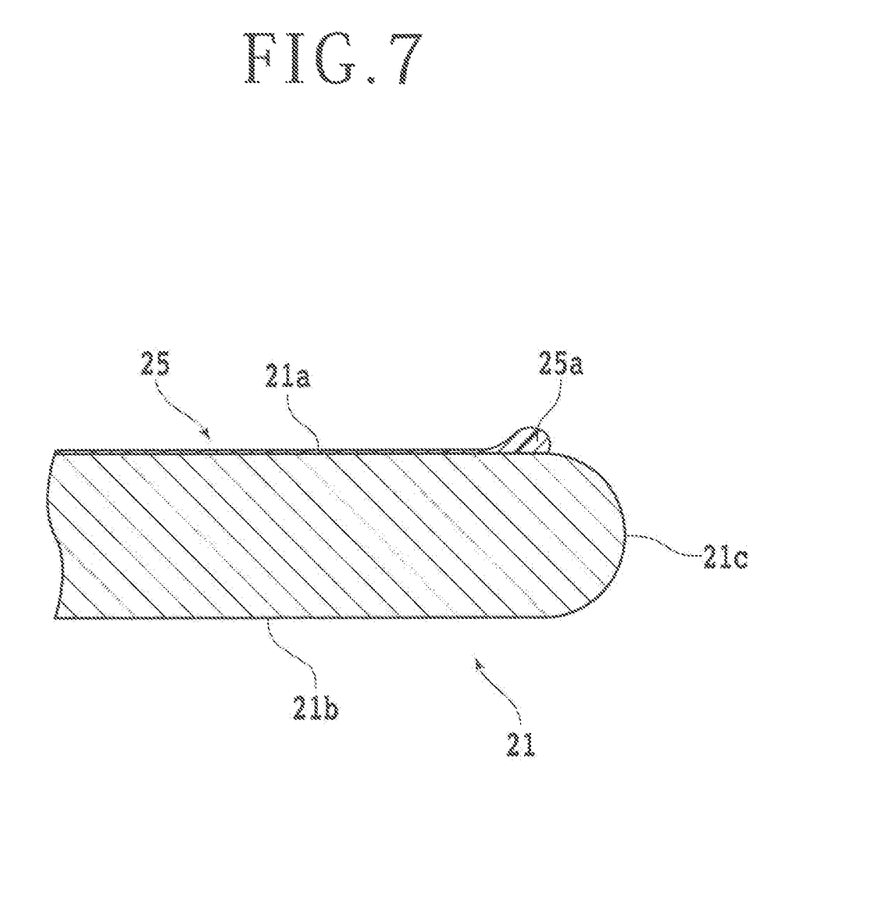
FIG. 7 is an enlarged fragmentary cross-sectional view of a wafer with no slanted surface and with a resist film on the wafer.

In other words, as the liquid material 13 is less likely to accumulate on the outer circumferential edge portion of the wafer 11, the possibility that the resist film 15 will swell on the outer circumferential edge portion of the wafer 11 is reduced. FIG. 7 illustrates in enlarged fragmentary cross section a wafer 21 with no slanted surface and with a resist film 25 formed on the wafer 21.

The wafer 21 is similar to the wafer 11 except that no slanted surface is formed thereon. Specifically, the wafer 21 is of a disk shape having a first surface 21a and a second surface 21b opposite the first surface 21a, i.e., on the back side of the wafer 21. The first surface 21a and the second surface 21b are joined to each other by an outer circumferential edge surface 21c curved by beveling.

If a resist film 25 is formed on the first surface 21a of the wafer 21 by a spin coating process, as illustrated in FIG. 7, the resist film 25 is highly likely to form a thicker swelling portion 25a on the outer circumferential edge portion of the wafer 21. Specifically, since no slanted surface is formed on the wafer 21, the liquid material 13 tends to accumulate on the outer circumferential edge portion of the wafer 21. When the spinner table 26 is rotated, the accumulated liquid material 13 on the outer circumferential edge portion of the wafer 21 is locally dried by an air stream, i.e., turbulence, produced on the outer circumferential edge portion of the wafer 21 by the rotation of the spinner table 26, resulting in the thicker swelling portion 25a thereon.

In the method of processing a wafer according to the present embodiment, as described above, inasmuch as the slanted surface 11d that is inclined to the first surface 11a so as to be progressively closer to the second surface 11b of the wafer 11 in the direction from the central area of the wafer 11 toward the outer circumferential edge thereof is formed on the first surface 11a side of the outer circumferential edge portion of the wafer 11, when the liquid material 13 that is to turn into the resist film 15 is applied to the first surface 11a of the wafer 11 by the spin coating process, it is easy for the liquid material 13 to flow down the slanted surface 11d and drain off from the wafer 11 to the outside thereof, upon flowing from the central area of the wafer 11 toward the outer circumferential edge thereof.

In other words, as the liquid material 13 is less likely to accumulate on the outer circumferential edge portion of the wafer 11, the possibility that the resist film 15 will swell on the outer circumferential edge portion of the wafer 11 is reduced even in a situation where the liquid material 13 applied to the wafer 11 is liable to be locally dried by an air stream, i.e., turbulence, produced around the wafer 11 by the rotation of the wafer 11.

Second Embodiment

A method of processing a wafer according to a second embodiment of the present invention will be described in detail below. According to the second embodiment, a slanted surface 11d is formed on a wafer 11 in a manner different from the first embodiment described above. Other details of the method according to the second embodiment than the processing step of forming the slanted surface 11d on the wafer 11 are the same as those of the method according to the first embodiment. Therefore, different details of the method according to the second embodiment will mainly be described below.

Figure 8:
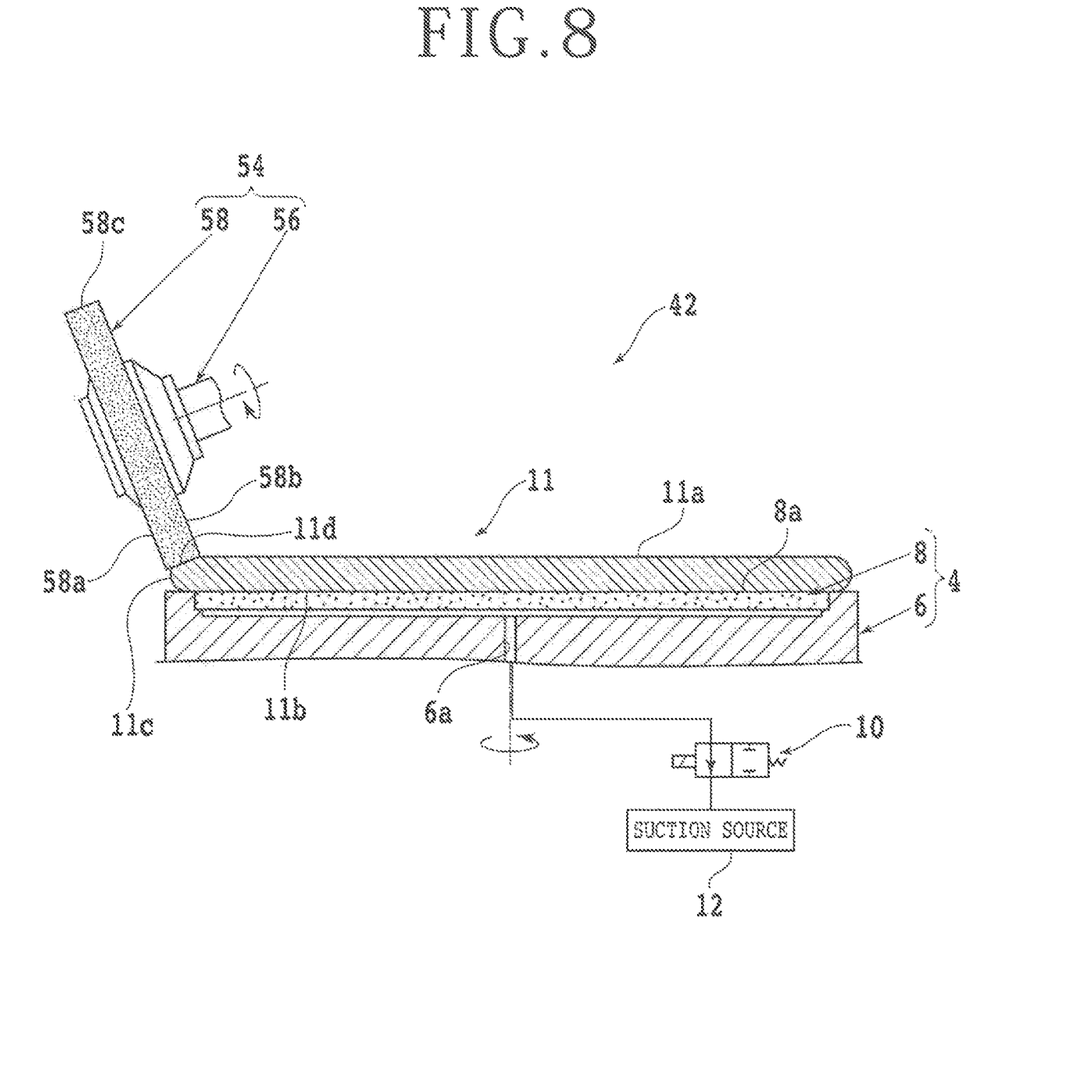
FIG. 8 is a cross-sectional view illustrating a manner in which a slanted surface is formed on the wafer in a method of processing a wafer according to a second embodiment of the present invention.

FIG. 8 illustrates in cross section a manner in which the slanted surface 11d is formed on the wafer 11 in the method according to the present embodiment. In FIG. 8, some components are represented by symbols and a functional block.

The method of processing a wafer according to the present embodiment is carried out using a processing apparatus 42 illustrated in FIG. 8. Specifically, the second surface lib of the wafer 11 is held on the chuck table 4 of the processing apparatus 42 (holding step), and thereafter, the slanted surface 11d is formed on the wafer 11 by the processing apparatus 42 (processing step). Some components of the processing apparatus 42 are identical to those of the processing apparatus 2 described above. Therefore, those components of the processing apparatus 42 that are identical to those of the processing apparatus 2 are denoted by identical reference characters, and their description will be omitted below.

As illustrated in FIG. 8, a cutting unit, i.e., a processing unit, 54 is disposed above the chuck table 4. The cutting unit 54 includes a spindle, or a rotational shaft, 56 that is capable of changing the angle of its own central axis with respect to the upper surface 8a of the porous plate 8, for example. A cutting blade, i.e., a processing tool, 58 including a grinding stone made of abrasive grains bound together by a bonding material is mounted on one end of the spindle 56.

The other end of the spindle 56 is coupled to a rotary actuator, not depicted, such as an electric motor. When the rotary actuator is energized, it generates and transmits rotational power to the spindle 56, rotating the cutting blade 58 on the spindle 56 about the central axis thereof. The cutting unit 54 is supported on a cutting unit moving mechanism, not depicted, for example. The cutting unit moving mechanism moves the cutting unit 54 in a second direction, i.e., a second horizontal direction, generally parallel to the upper surface 8a of the porous plate 8 and generally perpendicular to the first direction in which the chuck table 4 is movable, and in a third direction generally perpendicular to the first direction and the second direction.

The cutting blade 58 is of a disk shape including a first side surface 58a having a circular outer circumferential edge and a second side surface 58b having a circular outer circumferential edge that is of the same diameter as the first side surface 58a and positioned opposite the first side surface 58a, i.e., on the back side of the cutting blade 58. The outer circumferential edge of the first side surface 58a and the outer circumferential edge of the second side surface 58b are connected to each other by an outer circumferential surface 58c. In addition, at least the outer circumferential surface 58c is formed as a grinding stone made of abrasive grains such as diamond bound together by a bonding material such as a resin.

The cutting blade 58 is mounted on the one end of the spindle 56 such that the first side surface 58a and the second side surface 58b lie generally perpendicularly to the central axis of the spindle 56. The width or thickness of the cutting blade 58, i.e., the distance between the first side surface 58a and the second side surface 58b, is optionally set to a value matching the desired width of the slanted surface 11d to be formed. For example, the slanted surface 11d that is of a sufficient width can easily be formed on the wafer 11 by using the cutting blade 58 whose width is in a range from 0.5 mm to 3.0 mm, typically of 1 mm.

For forming the slanted surface 11d on the wafer 11, the spindle 56 as the rotational shaft is inclined with respect to the upper surface 8a of the porous plate 8, as illustrated in FIG. 8. In other words, the spindle 56 is inclined with respect to the first surface 11a and the second surface 11b of the wafer 11. Thereafter, the cutting blade 58 as it is rotated about the central axis thereof by the spindle 56 is caused to cut into the outer circumferential edge portion of the wafer 11 that includes the boundary between the first surface 11a and the outer circumferential edge surface 11c of the wafer 11. Then, the chuck table 4 is rotated to make one revolution about its own central axis.

The first side surface 58a of the cutting blade 58 is positioned closer to the outer circumferential edge of the wafer 11, and the second side surface 58b of the cutting blade 58 is positioned closer to the center of the wafer 11. Then, the spindle 56 is inclined such that the height of the lower end of the first side surface 58a is smaller than the height of the lower end of the second side surface 58b. However, in a case where the second side surface 58b is positioned closer to the outer circumferential edge of the wafer 11 and the first side surface 58a is positioned closer to the center of the wafer 11, the spindle 56 is inclined such that the height of the lower end of the second side surface 58b is smaller than the height of the lower end of the first side surface 58a.

The height of the cutting unit 54 at the time that the cutting blade 58 cuts into the wafer 11 is adjusted in such a range that only the outer circumferential surface 58c of the cutting blade 58 contacts the wafer 11. Specifically, for example, the height of the cutting unit 54 is adjusted such that the height of the lower end of the first side surface 58a of the cutting blade 58 is smaller than the height of the first surface 11a of the wafer 11 and the height of the lower end of the second side surface 58b of the cutting blade 58 is equal to or larger than the height of the first surface 11a.

The cutting blade 58 is thus allowed to cut into the first surface 11a side of the outer circumferential edge portion of the wafer 11, thereby forming the slanted surface 11d that is joined to the first surface 11a without abrupt height differences. The slanted surface 11d thus formed is inclined to the first surface 11a so as to be progressively closer to the second surface lib of the wafer 11 in a direction from the central area of the wafer 11 toward the outer circumferential edge thereof.

Specifically, the height of the slanted surface 11d is smaller on the outer circumferential edge surface 11c side, i.e., on an outer side of the wafer 11, than on the first surface 11a side, i.e., on an inner side of the wafer 11. Also, the thickness of the wafer 11 in the outer circumferential edge portion thereof where the slanted surface 11d is formed is smaller on the outer circumferential edge surface 11c side than on the first surface 11a side.

The angle $\Theta$ formed between the first surface 11a and the slanted surface 11d and the width W of the slanted surface 11d, i.e., the length of the slanted surface 11d along radial directions of the wafer 11, may be the same as those according to the first embodiment described above. After the slanted surface 11d has been formed on the wafer 11, the liquid material 13 is applied to the first surface 11a of the wafer 11 by the spin coating process, forming the resist film 15 on the first surface 11a of the wafer 11 (resist film forming step).

Also in the method of processing a wafer according to the present embodiment, since the slanted surface 11d is formed on the first surface 11a side of the outer circumferential edge portion of the wafer 11, when the liquid material 13 that is to turn into the resist film 15 is applied to the first surface 11a of the wafer 11 by the spin coating process, it is easy for the liquid material 13 to flow down the slanted surface 11d and drain off from the wafer 11 to the outside thereof, upon flowing from the central area of the wafer 11 toward the outer circumferential edge thereof.

In other words, as the liquid material 13 is less likely to accumulate on the outer circumferential edge portion of the wafer 11, the possibility that the resist film 15 will swell on the outer circumferential edge portion of the wafer 11 is reduced even in a situation where the liquid material 13 applied to the wafer 11 is liable to be locally dried by an air stream, i.e., turbulence, produced around the wafer 11 by the rotation of the wafer 11.

Third Embodiment

A method of processing a wafer according to a third embodiment of the present invention will be described in detail below. According to the third embodiment, a slanted surface 11d is formed on a wafer 11 in a manner different from the first and second embodiments described above. Other details of the method according to the third embodiment than the processing step of forming the slanted surface 11d on the wafer 11 are the same as those of the methods according to the first and second embodiments. Therefore, different details of the method according to the third embodiment will mainly be described below.

Figure 9:
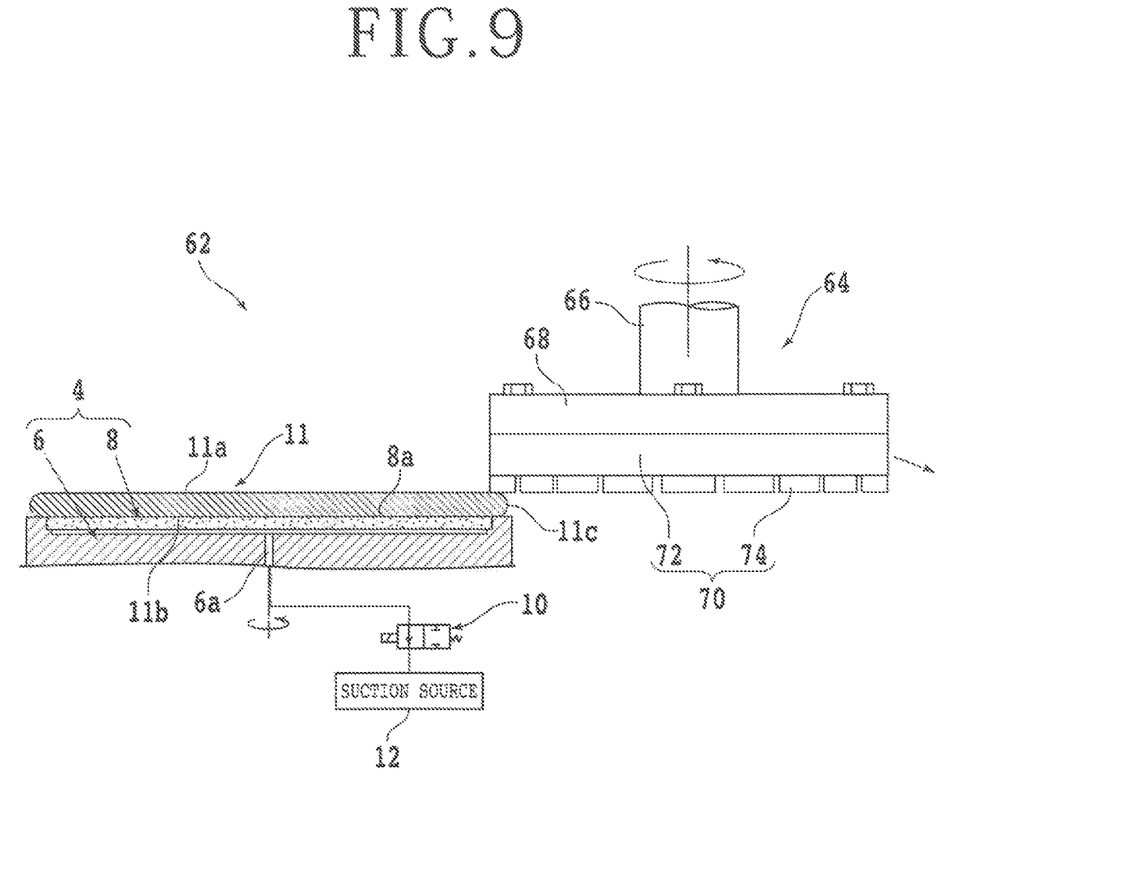
FIG. 9 is a cross-sectional view illustrating a manner in which a slanted surface is formed on the wafer in a method of processing a wafer according to a third embodiment of the present invention.

FIG. 9 illustrates in cross section a manner in which the slanted surface 11d is formed on the wafer 11 in the method according to the present embodiment. In FIG. 9, some components are represented by symbols and a functional block.

The method of processing a wafer according to the present embodiment is carried out using a processing apparatus 62 illustrated in FIG. 9. Specifically, the second surface 11b of the wafer 11 is held on the chuck table 4 of the processing apparatus 62 (holding step), and thereafter, the slanted surface 11d is formed on the wafer 11 by the processing apparatus 62 (processing step). Some components of the processing apparatus 62 are identical to those of the processing apparatus 2 and 42 described above. Therefore, those components of the processing apparatus 62 that are identical to those of the processing apparatus 2 and 42 are denoted by identical reference characters, and their description will be omitted below.

As illustrated in FIG. 9, a grinding unit, i.e., a processing unit, 64 is disposed above the chuck table 4. The grinding unit 64 includes a spindle 66 whose central axis extends generally perpendicularly to the upper surface 8a of the porous plate 8, for example. A disk-shaped mount 68 is fixed to a lower end of the spindle 66.

A grinding wheel, i.e., a processing wheel, 70 that is annular in shape which has a diameter generally equal to the diameter of the mount 68 is mounted on a lower surface of the mount 68. The grinding wheel 70 includes an annular wheel base 72 made of a material such as stainless steel, aluminum, or the like. The wheel base 72 has a lower surface to which there are fixed a plurality of grinding stones 74 each made of abrasive grains such as diamond or the like bound together by a bonding material such as a resin.

A rotary actuator, not depicted, such as an electric motor is coupled to an upper end of the spindle 66. When the rotary actuator is energized, it generates and transmits rotational power through the spindle 66 and the mount 68 to the grinding wheel 70 on the mount 68 on the lower end of the spindle 66, rotating the grinding wheel 70 about a central axis thereof. The grinding unit 64 is supported on a lifting and lowering mechanism, not depicted, for example. The grinding unit 64 can be moved in directions generally perpendicular to the upper surface 8a of the porous plate 8 by the lifting and lowering mechanism.

For forming the slanted surface 11d on the wafer 11, first, the chuck table 4 and the grinding unit 64 are moved relatively to each other to position an end of the grinding wheel 70 above the outer circumferential edge portion of the wafer 11 that includes the boundary between the first surface 11a and the outer circumferential edge surface 11c of the wafer 11 held on the chuck table 4.

Then, as illustrated in FIG. 9, while the chuck table 4 and the grinding wheel 70 are being rotated about their respective central axes, the grinding unit 64 is lowered. After at least the grinding stones 74 of the grinding wheel 70 have contacted the wafer 11, the chuck table 4 is relatively moved in a direction away from the grinding unit 64. Specifically, the grinding wheel 70 is moved with respect to the wafer 11 in a direction indicated by the arrow in FIG. 9, i.e., a direction from the central area of the wafer 11 toward the outer circumferential edge thereof.

Accordingly, the grinding stones 74 of the grinding wheel 70 grind the first surface 11a side of the outer circumferential edge portion of the wafer 11, forming the slanted surface 11d that is joined to the first surface 11a without abrupt height differences. The slanted surface 11d thus formed is inclined to the first surface 11a so as to be progressively closer to the second surface 11b of the wafer 11 in a direction from the central area of the wafer 11 toward the outer circumferential edge thereof.

Specifically, the height of the slanted surface 11d is smaller on the outer circumferential edge surface 11c side, i.e., on an outer side of the wafer 11, than on the first surface 11a side, i.e., on an inner side of the wafer 11. The thickness of the wafer 11 in the outer circumferential edge portion thereof where the slanted surface 11d is formed is smaller on the outer circumferential edge surface 11c side than on the first surface 11a side.

The angle $\Theta$ formed between the first surface 11a and the slanted surface 11d and the width W of the slanted surface 11d, i.e., the length of the slanted surface 11d along radial directions of the wafer 11, may be the same as those according to the first and second embodiments described above. After the slanted surface 11d has been formed on the wafer 11, the liquid material 13 is applied to the first surface 11a of the wafer 11 by the spin coating process, thereby forming the resist film 15 on the first surface 11a of the wafer 11 (resist film forming step).

Also in the method of processing a wafer according to the present embodiment, since the slanted surface 11d is formed on the first surface 11a of the wafer 11, when the liquid material 13 that is to turn into the resist film 15 is applied to the first surface 11a of the wafer 11 by the spin coating process, it is easy for the liquid material 13 to flow down the slanted surface 11d and drain off from the wafer 11 to the outside thereof, upon flowing from the central area of the wafer 11 toward the outer circumferential edge thereof.

In other words, as the liquid material 13 is less likely to accumulate on the outer circumferential edge portion of the wafer 11, the possibility that the resist film 15 will swell on the outer circumferential edge portion of the wafer 11 is reduced even in a situation where the liquid material 13 applied to the wafer 11 is liable to be locally dried by an air stream, i.e., turbulence, produced around the wafer 11 by the rotation of the wafer 11.

Fourth Embodiment

A method of processing a wafer according to a fourth embodiment of the present invention will be described in detail below. According to the fourth embodiment, a slanted surface 11d is formed on a wafer 11 in a manner different from the first, second, and third embodiments described above. Other details of the method according to the fourth embodiment than the processing step of forming the slanted surface 11d on the wafer 11 are the same as those of the methods according to the first, second, and third embodiments. Therefore, different details of the method according to the fourth embodiment will mainly be described below.

Figure 10:
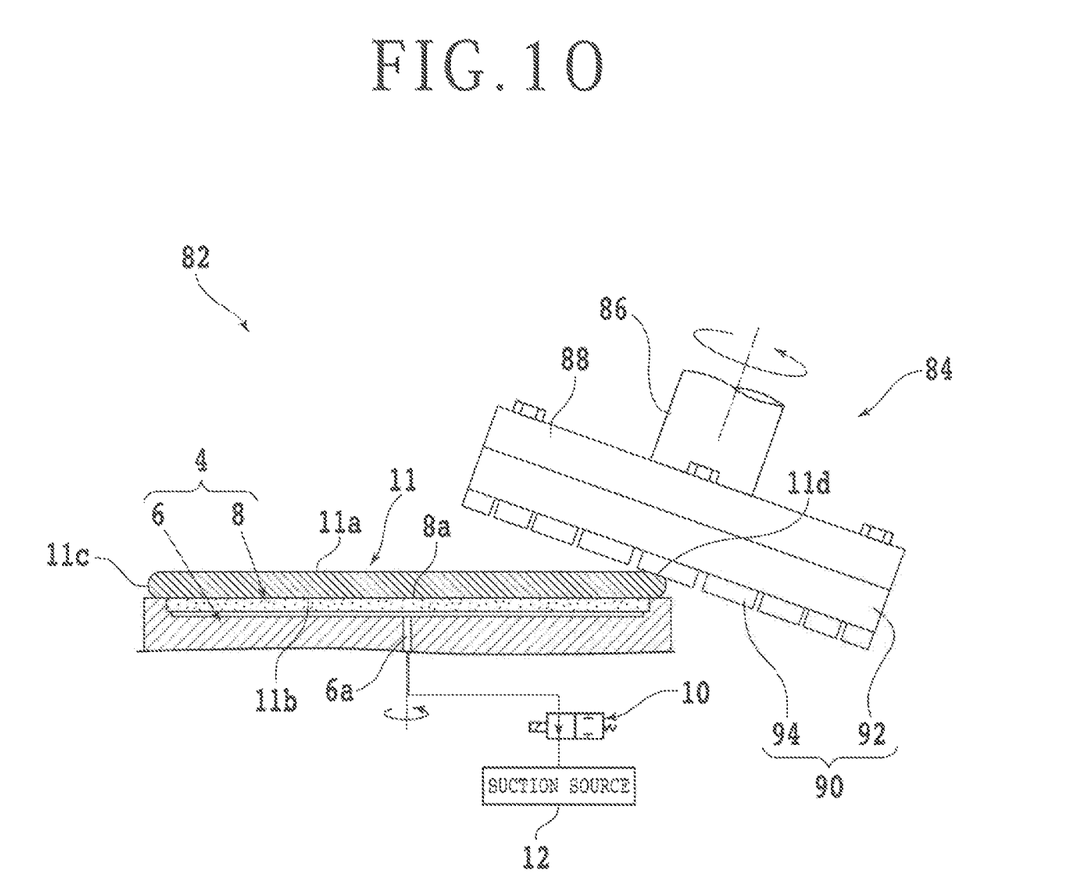
FIG. 10 is a cross-sectional view illustrating a manner in which a slanted surface is formed on the wafer in a method of processing a wafer according to a fourth embodiment of the present invention.

FIG. 10 illustrates in cross section a manner in which the slanted surface 11d is formed on the wafer 11 in the method according to the present embodiment. In FIG. 10, some components are represented by symbols and a functional block.

The method of processing a wafer according to the present embodiment is carried out using a processing apparatus 82 illustrated in FIG. 10. Specifically, the second surface 11b of the wafer 11 is held on the chuck table 4 of the processing apparatus 82 (holding step), and thereafter, the slanted surface 11d is formed on the wafer 11 by the processing apparatus 82 (processing step). Some components of the processing apparatus 82 are identical to those of the processing apparatus 2, 42, and 62 described above. Therefore, those components of the processing apparatus 82 that are identical to those of the processing apparatus 2, 42, and 62 are denoted by identical reference characters, and their description will be omitted below.

As illustrated in FIG. 10, a grinding unit, i.e., a processing unit, 84 is disposed above the chuck table 4. The grinding unit 84 includes a spindle, i.e., a rotational shaft, 86 that is capable of changing the angle of its own central axis with respect to the upper surface 8a of the porous plate 8, for example. A disk-shaped mount 88 is fixed to a lower end of the spindle 86.

A grinding wheel, i.e., a processing wheel, 90 that is annular in shape which has a diameter generally equal to the diameter of the mount 88 is mounted on a lower surface of the mount 88. The grinding wheel 90 includes an annular wheel base 92 made of a material such as stainless steel, aluminum, or the like. The wheel base 92 has a lower surface to which there are fixed a plurality of grinding stones 94 each made of abrasive grains such as diamond bound together by a bonding material such as a resin.

A rotary actuator, not depicted, such as an electric motor is coupled to an upper end of the spindle 86. When the rotary actuator is energized, it generates and transmits rotational power through the spindle 86 and the mount 88 to the grinding wheel 90 on the mount 88 on the lower end of the spindle 86, rotating the grinding wheel 90 about a central axis thereof. The grinding unit 84 is supported on a lifting and lowering mechanism, not depicted, for example. The grinding unit 84 can be moved in directions generally perpendicular to the upper surface 8a of the porous plate 8 by the lifting and lowering mechanism.

For forming the slanted surface 11d on the wafer 11, the spindle 86 as the rotational shaft is inclined with respect to the upper surface 8a of the porous plate 8, as illustrated in FIG. 10. In other words, the spindle 86 is inclined with respect to the first surface 11a and the second surface 11b of the wafer 11. Thereafter, the chuck table 4 and the grinding unit 84 are moved relatively to each other to position an end of the grinding wheel 90 above the outer circumferential edge portion of the wafer 11 that includes the boundary between the first surface 11a and the outer circumferential edge surface 11c of the wafer 11 held on the chuck table 4.

Then, as illustrated in FIG. 10, while the chuck table 4 and the grinding wheel 90 are being rotated about their respective central axes, the grinding unit 84 is lowered to bring the grinding stones 94 of the grinding wheel 90 into contact with the outer circumferential edge portion of the wafer 11. The spindle 86 has been inclined with respect to the upper surface 8a of the porous plate 8 such that the height of the lower surfaces of the grinding stones 94 which is brought into contact with the wafer 11 is lower on the outer circumferential edge side of the wafer 11 than on the center side thereof.

Accordingly, the first surface 11a side of the outer circumferential edge portion of the wafer 11 is now ground by the grinding stones 94 of the grinding wheel 90, forming the slanted surface 11d that is joined to the first surface 11a without abrupt height differences. The slanted surface 11d thus formed is inclined to the first surface 11a so as to be progressively closer to the second surface 11b of the wafer 11 in a direction from the central area of the wafer 11 toward the outer circumferential edge thereof.

The height of the slanted surface 11d is smaller on the outer circumferential edge surface 11c side, i.e., on an outer side of the wafer 11, than on the first surface 11a side, i.e., on an inner side of the wafer 11. The thickness of the wafer 11 in the outer circumferential edge portion thereof where the slanted surface 11d is formed is smaller on the outer circumferential edge surface 11c side than on the first surface 11a side.

The angle $\Theta$ formed between the first surface 11a and the slanted surface 11d and the width W of the slanted surface 11d, i.e., the length of the slanted surface 11d along radial directions of the wafer 11, may be the same as those according to the first, second, and third embodiments described above. After the slanted surface 11d has been formed on the wafer 11, the liquid material 13 is applied to the first surface 11a of the wafer 11 by the spin coating process, forming the resist film 15 on the first surface 11a of the wafer 11 (resist film forming step).

Also in the method of processing a wafer according to the present embodiment, since the slanted surface 11d is formed on the first surface 11a of the wafer 11, when the liquid material 13 that is to turn into the resist film 15 is applied to the first surface 11a of the wafer 11 by the spin coating process, it is easy for the liquid material 13 to flow down the slanted surface 11d and drain off from the wafer 11 to the outside thereof, upon flowing from the central area of the wafer 11 toward the outer circumferential edge thereof.

In other words, as the liquid material 13 is less likely to accumulate on the outer circumferential edge portion of the wafer 11, the possibility that the resist film 15 will swell on the outer circumferential edge portion of the wafer 11 is reduced even in a situation where the liquid material 13 applied to the wafer 11 is liable to be locally dried by an air stream, i.e., turbulence, produced around the wafer 11 by the rotation of the wafer 11.

The present invention is not limited to the embodiments described above, but various changes and modifications may be made therein. For example, the methods of processing a wafer according to the above embodiments use two types of apparatus including the processing apparatus 2 and the like and the spin coater 22. However, the method of processing a wafer according to the present invention may use a single composite apparatus that has both the function of the processing apparatus 2 and the like and the function of the spin coater 22.

Structural and functional details according to the above embodiments and modifications may be changed and modified without departing from the scope of the present invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer having a first surface and a second surface opposite the first surface, comprising the steps of:
    holding the second surface of the wafer such that the first surface thereof is exposed;
    positioning a processing tool including a rotational axis relative to the first surface of the wafer so that the rotational axis is at an angle relative to the first surface of the wafer, wherein the angle is between 0° and 90°, and wherein the processing tool includes a grinding stone made of abrasive grains bound together by a bonding material;
    after holding the second surface of the wafer, processing an exposed first surface side of an outer circumferential edge portion of the wafer without processing the second surface of the wafer, with the processing tool, thereby forming on the outer circumferential edge portion a slanted surface that is inclined to the first surface so as to be progressively closer to the second surface in a direction from a central area of the wafer toward an outer circumferential edge thereof; and
    after forming the slanted surface, coating the first surface of the wafer with a liquid material according to a spin coating process, thereby forming a resist film on the first surface of the wafer.

2. The method of processing a wafer according to claim 1, wherein the processing tool includes a disk-shaped cutting blade including a first side surface having a circular outer circumferential edge, a second side surface having a circular outer circumferential edge and positioned opposite the first side surface, and an outer circumferential surface formed of the grinding stone and connecting the outer circumferential edge of the first side surface and the outer circumferential edge of the second side surface to each other, and
    the step of forming the slanted surface includes the step of causing the cutting blade to cut into the outer circumferential edge portion of the wafer while the cutting blade is being rotated by a rotational shaft inclined to the first surface of the wafer.

3. The method of processing a wafer according to claim 1, wherein the processing tool includes a grinding wheel having the grinding stone.

4. The method of processing a wafer according to claim 1, wherein the outer circumferential edge is flat.

5. The method of processing a wafer according to claim 1, wherein an angle Θ formed between the first surface and the slanted surface is in a range of 10° to 25°.

6. The method of processing a wafer according to claim 1, wherein positioning the processing tool including the grinding stone includes contacting the wafer with only an outer circumferential surface of the grinding stone.

7. The method of processing a wafer according to claim 1, further comprising adjusting an angle of the rotational axis relative to the first surface.

8. A method of processing a wafer having a first surface and a second surface opposite the first surface, comprising the steps of:
    holding the second surface of the wafer such that the first surface thereof is exposed;
    after holding the second surface of the wafer, processing an exposed first surface side of an outer circumferential edge portion of the wafer without processing the second surface of the wafer, with a processing tool, thereby forming on the outer circumferential edge portion a slanted surface that is inclined to the first surface so as to be progressively closer to the second surface in a direction from a central area of the wafer toward an outer circumferential edge thereof,
    wherein the processing tool includes a frustoconical cutting blade including a first side surface having a circular outer circumferential edge, a second side surface having a circular outer circumferential edge that is larger in diameter than the first side surface and positioned opposite the first side surface, and an outer circumferential surface formed by a grinding stone and connecting the outer circumferential edge of the first side surface and the outer circumferential edge of the second side surface to each other, the outer circumferential surface being inclined to the first side surface and the second side surface, and
    wherein forming the slanted surface includes the step of causing the cutting blade to cut into the outer circumferential edge portion of the wafer such that the second side surface of the cutting blade is positioned closer to the outer circumferential edge of the wafer,
    after forming the slanted surface, coating the first surface of the wafer with a liquid material according to a spin coating process, thereby forming a resist film on the first surface of the wafer.

9. The method of processing a wafer according to claim 2, wherein an angle Θ formed between the first surface and the slanted surface is in a range of 10° to 25°.

* * * * *